US011631762B1

(12) United States Patent
Potera

(10) Patent No.: US 11,631,762 B1
(45) Date of Patent: Apr. 18, 2023

(54) PLANAR MOSFET WITH REDUCED SENSITIVITY OF JFET RESISTANCE TO PROCESS VARIATION

(71) Applicant: SemiQ Incorporated, Lake Forest, CA (US)

(72) Inventor: Rahul R. Potera, Irvine, CA (US)

(73) Assignee: SEMIQ INCORPORATED, Lake Forest, CA (US)

( * ) Notice: Subject to any disclaimer, the term of this patent is extended or adjusted under 35 U.S.C. 154(b) by 242 days.

(21) Appl. No.: 17/315,608

(22) Filed: May 10, 2021

(51) Int. Cl.
  *H01L 29/78* (2006.01)
  *H01L 21/26* (2006.01)
  *H01L 29/16* (2006.01)
  *H01L 21/265* (2006.01)
  *H01L 29/66* (2006.01)
  *H01L 29/808* (2006.01)

(52) U.S. Cl.
  CPC .... *H01L 29/7803* (2013.01); *H01L 21/26513* (2013.01); *H01L 21/26586* (2013.01); *H01L 29/1608* (2013.01); *H01L 29/66068* (2013.01); *H01L 29/808* (2013.01)

(58) Field of Classification Search
  CPC . H01L 21/26; H01L 21/265; H01L 21/26513; H01L 21/26586; H01L 29/16; H01L 29/1608; H01L 29/66; H01L 29/66068; H01L 29/78; H01L 29/7803; H01L 29/80; H01L 29/808
  USPC .......................................................... 257/77
  See application file for complete search history.

(56) References Cited

U.S. PATENT DOCUMENTS 11,183,566 B1 * 11/2021 Sundaresan ......... H01L 29/1095

* cited by examiner

*Primary Examiner* — Fazli Erdem
(74) *Attorney, Agent, or Firm* — The Law Offices of Bradley J. Bereznak

(57) ABSTRACT

A silicon carbide planar MOSFET includes a junction field-effect transistor (JFET) region that extends up to a top planar surface of the substrate. The JFET region includes a central area, which comprises a portion of the drift region that extends vertically to the top planar surface. First and second sidewall areas are disposed on opposite sides of the central area. The central area has a first lateral width and a first doping concentration. The first and second sidewall areas extend vertically to the top planar surface, with each having a second lateral width. The first and second sidewall areas each have a second doping concentration that is greater than the first doping concentration such that, at a zero bias condition, first and second depletion regions respectively extend only within the first and second sidewall areas of the JFET region.

19 Claims, 9 Drawing Sheets

For equal $R_{sp}$ and $C_{sp}$, $$N_{j1}\left[W - \sqrt{\frac{2\epsilon V_{bi}}{qN_{j1}}}\right] = N_{j2}\left\{W - \sqrt{\frac{2\epsilon V_{bi}}{qN_{j2}}} - W_2\right\} + N_d W_2 \quad \leftarrow 51$$

$$W_2 = \frac{(N_{j2} - N_{j1})W - (\sqrt{N_{j2}} - \sqrt{N_{j1}})\sqrt{\frac{2\epsilon V_{bi}}{q}}}{N_{j2} - N_d} \quad \leftarrow 52$$

$$R_{spj1} = \frac{dp}{N_{j1}\, q\mu \times 2 \times \left\{W - \sqrt{\frac{2\epsilon V_{bi}}{q N_{j1}}}\right\}} \quad \leftarrow 61$$

$$C_{spj1} = 2 N_{j1}\, q\mu \left\{W - \sqrt{\frac{2\epsilon V_{bi}}{q N_{j1}}}\right\} \quad \leftarrow 62$$

$$R_{spj2} = \frac{dp}{q\mu \times 2 \times \left[N_{j2}\left\{W - \sqrt{\frac{2\epsilon V_{bi}}{q N_{j2}}} - W_2\right\} + N_d W_2\right]} \quad \leftarrow 63$$

$$C_{spj2} = 2 q\mu \left[N_{j2}\left\{W - \sqrt{\frac{2\epsilon V_{bi}}{q N_{j2}}} - W_2\right\} + N_d W_2\right] \quad \leftarrow 64$$

$$65 \rightarrow \frac{dC_{spj1}}{dW} = 2 N_{j1}\, q\mu \qquad \frac{dC_{spj2}}{dW} = 2 q\mu N_{j2} \frac{d(W - W_2)}{dW} + 2 q\mu N_d \quad \leftarrow 66$$

If $W - W_2$ is a constant, then:

$$\frac{dC_{spj2}}{dW} = 2 q\mu N_d = \left(\frac{N_d}{N_{j1}}\right) \frac{dC_{spj1}}{dW} \quad \leftarrow 67$$

FIG. 6

| Parameter | JFET #1 (Prior Art) | JFET #2 (Prior Art) | JFET #3 |
|---|---|---|---|
| Drift doping | $N_d = 1E16/cm3$ | $N_d = 1E16/cm3$ | $N_d = 1E16/cm3$ |
| JFET doping | $N_{j1} = 3E16/cm3$ | $N_{j1} = 3E16/cm3$ | $N_{j2} = 4.5E16/cm3$ |
| JFET width (2W) | 1.5 μm | 1.0 um | 1.0 um |
| JFET width variation (ΔW) | +/- 0.2 μm | +/- 0.2 μm | +/- 0.2 μm |
| Low-doped JFET width (2W$_2$) | N/A | N/A | 0.3 μm |
| JFET depth (d) | 1.0 μm | 1.0 μm | 1.0 μm |
| Pitch (p) | 5.5 μm | 5.5 μm | 5.5 μm |
| JFET Specific Resistance (2W) | 0.27 MΩcm$^2$ | 0.68 MΩcm$^2$ | 0.68 MΩcm$^2$ |
| JFET Specific Resistance (2W+ΔW) | 0.22 MΩcm$^2$ | 0.43 MΩcm$^2$ | 0.57 MΩcm$^2$ |
| JFET Specific Resistance (2W-ΔW) | 0.36 MΩcm$^2$ | 1.68 MΩcm$^2$ | 0.85 MΩcm$^2$ |

FIG. 7

PLANAR MOSFET WITH REDUCED SENSITIVITY OF JFET RESISTANCE TO PROCESS VARIATION

TECHNICAL FIELD

The present disclosure relates to silicon carbide power semiconductor devices. More specifically, the present invention relates to planar silicon carbide metal-oxide semiconductor field-effect transistor (MOSFET) device structures and layouts capable of withstanding high voltages.

BACKGROUND

High-voltage, field-effect transistors, also known as power transistors or power semiconductor devices, are well known in the semiconductor arts. Most often, a high-voltage power transistor comprises a transistor device structure that includes an extended drain or drift region that supports the applied high-voltage when the device is in the "off" state. Power transistors of this type can be switched at high voltages and achieve a high blocking voltage in the "off" state while minimizing the resistance to current flow between the drain and source, often referred to as the specific on-resistance ($R_{sp}$), in the "on" state.

Power MOSFETs are commonly based on silicon and other wide bandgap semiconductor materials, such as silicon carbide. Silicon carbide (SiC) MOSFETs are advantageously utilized in certain electronic devices due to their superior physical properties over silicon-based devices of the same device area. For example, SiC MOSFETs are known to exhibit higher blocking voltage, lower $R_{on}$, and higher thermal conductivity as compared to silicon MOSFETs. A double-implanted metal-oxide semiconductor field-effect transistor (DMOSFET) may be formed in a SiC substrate.

Many power MOSFETs employ a device structure that includes an extended drain region that supports or blocks the applied high-voltage (e.g., hundreds of volts or more) when the device is in the "off" state. FIG. 1 illustrates a cross-section of a traditional power DMOSFET device 10 that includes an epitaxial layer 14 of lightly-doped N− type silicon carbide (SiC) material, which forms an extended drain or drift region for current flow in the on-state.

FIG. 1 shows DMOSFET 10 as a cell having a half-pitch that extends laterally from a zero-point centered in JFET region 13. The lateral boundaries of the P+ body or well regions 16 are shown being a lateral distance W from the zero-point in the center of JFET region 13. Thus, the full lateral width of JFET region 13 is a distance 2W.

A gate structure consisting of a polysilicon gate member 15 is formed above a top substrate surface 21 of device 10. Gate member 15 is insulated from the underlying semiconductor material by a thin gate oxide layer 19 and from source metal 22 by an inter-layer dielectric (ILD) 18. Application of an appropriate voltage potential to gate 15 causes conductive channels 11 to be formed in body or well regions 16 just beneath surface 21 such that current may flow from source metal 22 laterally (horizontally) through N+ source regions 12, channel regions 11, and then vertically downward through N+ JFET region 13, epitaxial drift layer 14, down through the bottom of N+ substrate 20 to drain metal layer 23.

The specific on-resistance ($R_{sp}$) of a DMOSFET is a combination of the source contact resistance, source semiconductor resistance, channel resistance, JFET resistance, drift resistance, substrate resistance, and drain contact resistance. In a typical 650 V rated SiC DMOSFET the major components of $R_{sp}$ are: ~40% channel resistance, ~25% JFET resistance, ~20% drift resistance and ~15% substrate resistance. JFET resistance is therefore a significant portion of total $R_{sp}$ for a 650 V device. JFET resistance becomes a less significant part of the total on-state resistance the higher the voltage rating of the device.

It is well known that increasing the doping of the JFET region increases the conductivity and reduces resistivity. However, in blocking mode (off-state) this also increases the electric field seen by the gate oxide. For reliable operation, the electric field across the gate oxide at a rated blocking voltage should be kept below ~3.5 MV/cm², which limits how high the JFET doping can be increased.

Another approach to reducing JFET resistance is to widen the JFET region. But this approach is also limited by the electric field in the gate oxide. The reason why is because the wider the JFET region, the less the P-well regions shield the electric field from the gate oxide in the off-state blocking mode. Additionally, the wider the JFET region, the larger the pitch of the device, which increases on-resistance. A lower width reduces the gate oxide electric field but it also increases JFET resistance. On the other hand, higher doping increases the gate oxide electric field while reducing JFET resistance. Accordingly, practitioners have attempted to optimize design of SiC power DMOSFETs by appropriate selection of JFET doping and width, with an aim to reduce JFET $R_{sp}$ while maintaining the reliability of the gate oxide.

Another problem is that as JFET width is reduced, device performance becomes increasingly susceptible to inherent fabrication, process variations. For example, JFET width in a typical process might only be controlled to a precision of +/−0.2 µm. If JFET width is designed to be 2 µm, then the lowest possible JFET width is 1.8 µm in this process. Assuming 0.3 µm on both sides of the JFET region are depleted at zero bias, this means that the effective JFET width shrinks from 1.4 µm to 1.2 µm, which causes JFET resistance to increase by 14%.

If JFET width is designed to be 1.2 µm, however, then the lowest possible JFET width is 1.0 µm in this process. Assuming 0.3 µm on both sides of the JFET region are depleted at zero bias, this means the effective JFET shrinks from 0.6 µm to 0.4 µm, which causes JFET resistance to increase by 33%. A given design may have the latitude to absorb the center case of 14% increase in JFET resistance, which for a 650V SiC MOSFET might be a 3% increase in total on-state specific resistance. But the extreme case of 33% increase in JFET resistance leads to a 9% increase in total resistance, which depresses device performance and/or causes large yield loss.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 6 shows a set of equations that demonstrate reduced sensitivity of JFET resistance in the device structure of FIG. 2 to process variation.

FIG. 7 is a chart of simulation results comparing the sensitivity of JFET resistance to process variation for several different DMOSFET device structures.

Figure 1:
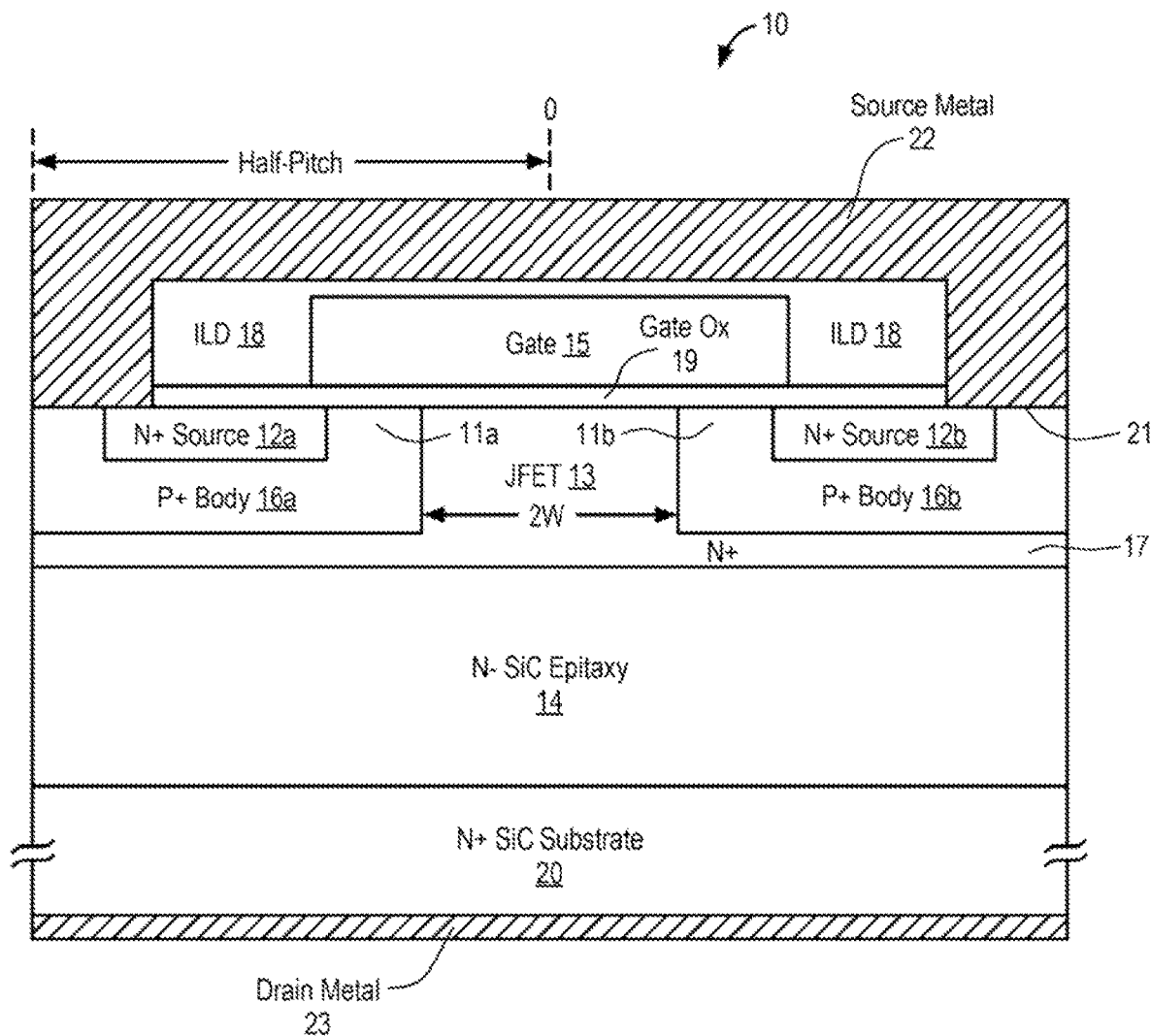
FIG. 1 illustrates a cross-sectional side view of a traditional SiC DMOSFET.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the disclosed subject matter. Also, common but well-understood features and processing steps that are useful or necessary in a commercially feasible embodiment are often not depicted in order to facilitate a less obstructed view of these various embodiments presented.

DETAILED DESCRIPTION

In the following description numerous specific details are set forth in order to provide a thorough understanding of the disclosed subject matter. It will be apparent, however, to one having ordinary skill in the art that the specific details need not be employed to practice the various embodiments described. In other instances, well-known systems, devices, or methods have not been described in detail in order to avoid obscuring the disclosed subject matter.

Reference throughout this specification to "one embodiment", "an embodiment", "one example" or "an example" means that a particular feature, structure or characteristic described in connection with the embodiment or example is included in at least one embodiment of the disclosed subject matter. Thus, appearances of the phrases "in one embodiment", "in an embodiment", "one example" or "an example" in various places throughout this specification are not necessarily all referring to the same embodiment or example. In addition, it is appreciated that the figures provided herewith are for explanation purposes to persons ordinarily skilled in the art and that the drawings are not necessarily drawn to scale.

As used herein, a "wafer" is a thin slice of crystalline material, such as silicon carbide, used in the fabrication of semiconductor devices and integrated circuits. The term "substrate" refers to the semiconductor supporting material upon which or within which the elements of a semiconductor device are fabricated, which substantially comprises the thickness of a wafer. Upon completion of the fabrication process the wafer is typically scribed and broken into individual semiconductor die, each of which consists of one or more semiconductor devices.

It is appreciated that the device structures shown and disclosed herein may represent a single device cell or unit. Each of the device cells shown may be replicated in a mirrored or translated fashion many times in two-dimensional layouts across a wafer to form a completely fabricated SiC transistor device.

In the context of the present application, when a transistor is in an "off state" or "off" the transistor does not substantially conduct current. Conversely, when a transistor is in an "on state" or "on" the transistor is able to substantially conduct current. By way of example, a power transistor may comprise an N− channel DMOSFET with a SiC substrate and SiC epitaxial layer which, in the off-state, supports a high blocking voltage between a first terminal, a drain, and a second terminal, a source. The power DMOSFET may comprise a power switch that is driven by an integrated controller circuit to regulate energy provided to a load.

A SiC DMOSFET device structure with a JFET region having specific doping profile that includes implanted sidewall regions and a central region of epitaxial semiconductor material is described. The novel SiC DMOSFET device provides reduced sensitivity of JFET resistance, which is a significant portion of total specific on-resistance, to process variation affecting the width of the JFET region. In various embodiments the device structure allows for a reduction in the overall width of the JFET region, which reduces lateral transistor cell pitch.

Figure 2:
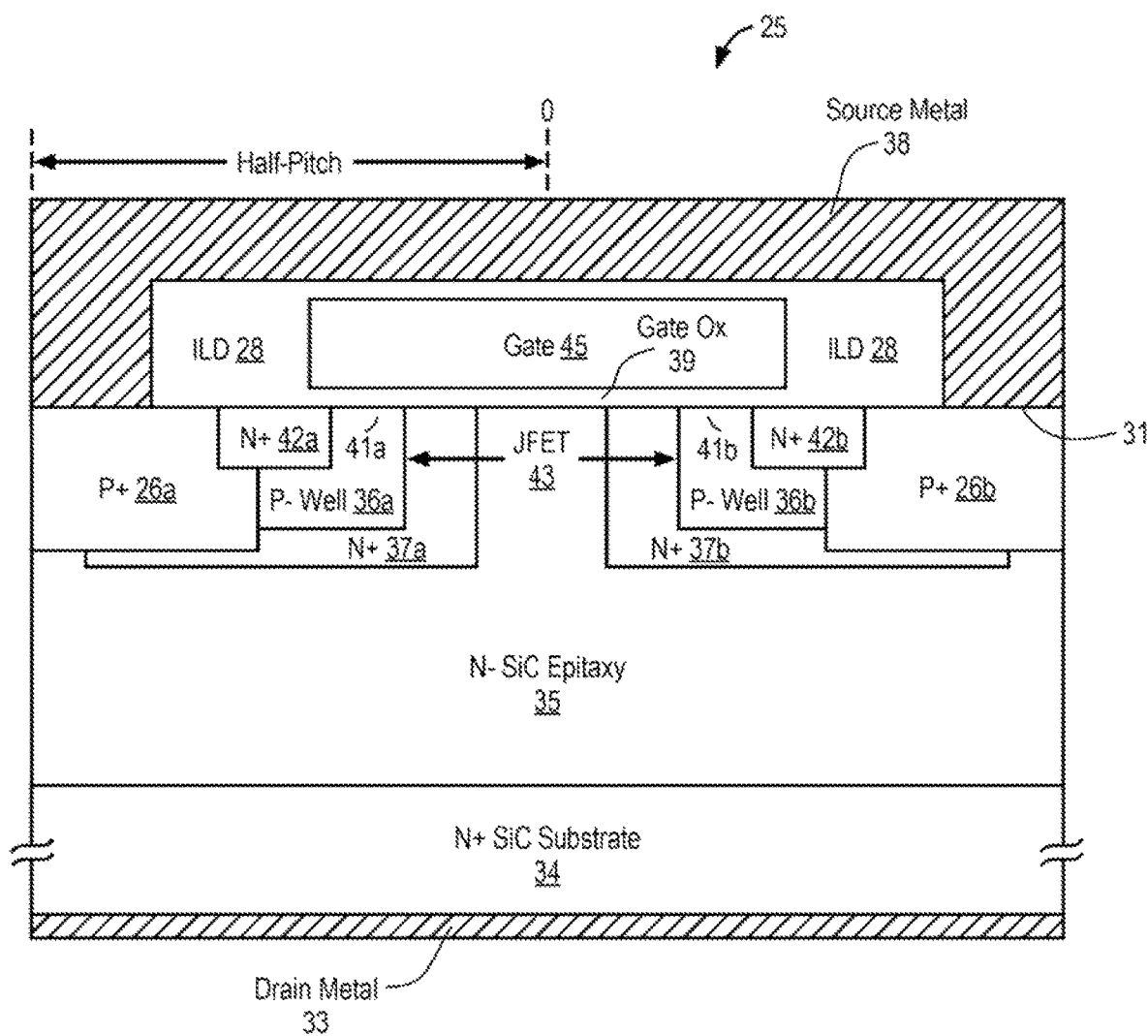
FIG. 2 is an example cross-sectional side view of a SiC DMOSFET device structure with reduced sensitivity of JFET resistance to process variation.

FIG. 2 is an example cross-sectional side view of a SiC DMOSFET device 25 with reduced sensitivity of JFET resistance to process variation. It is appreciated that the portion of the cross-section shown may represent a single transistor cell. The transistor cell shown may be replicated in a mirrored or translated fashion many times across a wafer to form a completely fabricated SiC DMOSFET device. DMOSFET 25 includes a lightly-doped N− SiC epitaxial layer 35 disposed directly above a more highly-doped N+ SiC substrate 34. Epitaxial layer 35 forms an extended drain or drift region of SiC MOSFET 25. Epitaxial layer 35 may be formed by a Chemical Vapor Deposition (CVD) process.

A drain metal layer 33 contacts the bottom planar surface of SiC substrate 34. In certain embodiments an N+ drain layer may be disposed between substrate 34 and drain metal 33. in one embodiment drain metal 33 and source metal 38 both comprise aluminum.

Note that a portion of N− epitaxial layer 35 is shown extending up to a top planar surface 31 of the substrate. The portion that extends up to top surface 31 forms a central area of JFET region 43 of SiC DMOSFET 25. JFET region 43 is bounded laterally by lightly-doped P− well regions 36a & 36b. Included in JFET region 43 are a pair of N+ JFET sidewall areas 37a and 37b that respectively adjoin P− well regions 36a & 36b. N+ JFET sidewall areas 37a and 37b respectively extend laterally beneath P− well regions 36a & 36b and also under a portion of P+ body regions 26a & 26b, respectively. N+ source regions 42 & 42b are shown adjoining top surface 31. Each of N+ source regions 42 & 42b are disposed partially within P− well regions 36a & 36b, and partially within P+ regions 26a & 26b, respectively. Each P+ body region 26 is shown adjoining a corresponding N+ source region 42 and a corresponding P− well region 36.

The channel regions 41a & 41b are defined in the substrate where the respective P− wells 36a & 36b extend up to top planar surface 31. The length of each channel region 41 is measured by the lateral distance between the source region 42 and JFET region 43.

Continuing with the example of FIG. 2, a gate member 45 is shown disposed above top planar surface 31. Gate member 45 is insulated from the underlying semiconductor regions by a thin gate dielectric (e.g., oxide) 39. An interlayer dielectric (ILD) 28 covers the top and sides of gate member 45, fully insulating gate member 45 from top metal layer 38. In one embodiment, ILD 28 comprises an oxide and gate member 45 comprises polysilicon. Gate member 45 extends laterally over channel regions 41, JFET region 43, as well as over a small portion of source regions 42. When a sufficiently high voltage is applied to gate member 45 relative to source region 42, a conduction channel forms just beneath top planar surface 31 in each channel region 41. Thus, in the on-state current flow in DMOSFET 25 horizontally from N+ source regions 42 to JFET region 43, and then vertically down through N− epitaxy layer (drift region) 35 and N+ substrate 34.

In the cross-sectional view of FIG. 2 source metal 38 electrically contacts P+ body regions 26a & 26b. It is appreciated that a thin contact metal (e.g., tungsten, titanium, etc.) may be disposed between source metal 38 and regions 26 to improve the conductivity of each ohmic contact.

One characteristic of the device structure shown in FIG. 2 is that the N− type doping varies across the lateral width or distance of JFET region 43. Practitioners in the art will appreciate that JFET region 13 of traditional DMOSFET 10 is implanted with an N−type dopant in the entire active area to achieve a uniform doping concentration ($N_{j1}$). When JFET region 13 reduces in width due to process variation, the JFET resistivity $R_{sp1}$ increases in proportion to the doping $N_{j1}$ of JFET region 13

In contrast in DMOSFET 25, while the width of the entire JFET region 43 may vary with spacing between the P− Well regions 36, the N+ sidewall areas 37a & 37b of the JFET with higher doping ($N_{j2}$) are self-aligned to respective P− Well regions 36a & 36b, so any variation of P− well spacing only varies the central area of JFET region 43 that is doped much lower ($N_d$). That is, $N_{j2} > N_{j1} > N_d$. In the case where JFET region 43 reduces in width due to process variation, JFET resistance increases only in proportion to the drift resistance $N_d$. Since $N_d < N_{j1}$, the sensitivity of JFET resistance to process variation is significantly reduced.

For example, in a 650 V DMOSFET 25 as shown in FIG. 2 N− epitaxial layer 35 may have a doping concentration $N_d = 1E15/cm3$ and $N_{j2} = 6E15/cm3$, whereas a similar designed traditional device may have a JFET doping $N_{j1} = 3E15/cm3$. The depth (d) of P− Well regions 36, which is the same as the depth of JFET region 43, is ~1.0 µm but may vary from 0.7 µm to 1.3 µm or deeper. By way of further example, the total width (2W) of JFET region 43, as measured from the lateral boundary of P− Well region 36a to the lateral boundary of P− Well region 36b, may be 1.5 µm or less. P− Wells 36 may have a retrograde doping profile of about 2E18/cm3 near the junction with N− epitaxial layer 35, lowering to about 1E17/cm3 in the channel region 41 near top surface 31.

The width of the central area (doped $N_d$) of JFET region 43 should be greater than this process variation. In other words, if the lateral process variation is equal to −0.2 µm then the width (2*$W_2$) of the central area should be greater than 0.2 µm, e.g., 0.3 µm. This, combined with the alignment of the N+ sidewall areas 37 to P− Well regions 36, insures that the entire process variation is captured in the central lower doped (N−) area of JFET region 43, thereby making DMOSFET 25 less sensitive to process variation than traditional designs.

Figure 3A:
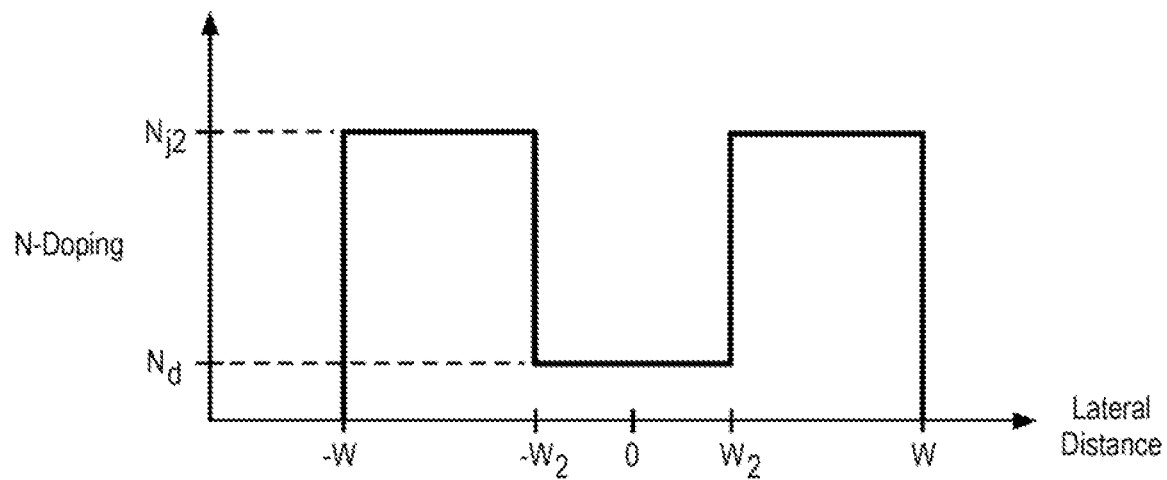
FIG. 3A is a graph of doping concentration in the DMOSFET device shown in FIG. 1 versus the lateral distance across the width of the JFET region.
Figure 3B:
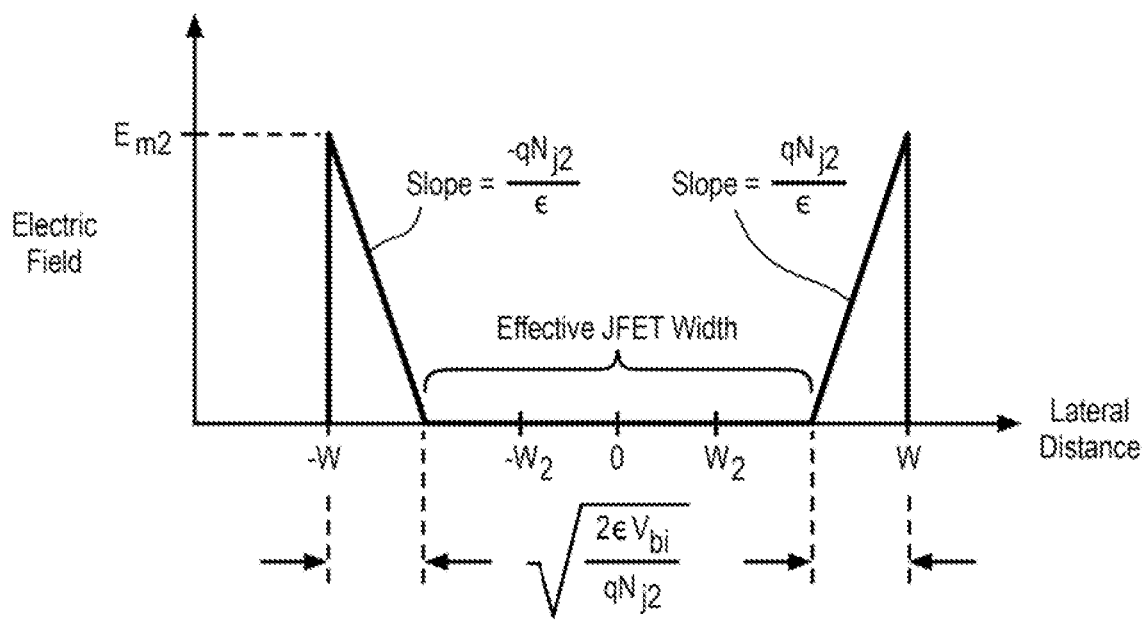
FIG. 3B is a graph of electric field in the DMOSFET device shown in FIG. 1 versus the lateral distance across the width of the JFET region.

The lateral width (W−$W_2$) of each of the N+ sidewall areas 37 should also be greater than the corresponding depleted regions shown in FIG. 3B (i.e.. the electric field triangular regions) so that the effective JFET width includes an undepleted portion of each of the higher-doped N+ sidewall areas 37.

A typical pitch (p) of device 25 may be 6.0 µm or less. SiC substrate 34 may have a doping concentration of about 4E18/cm3 with the thickness being in a range of 100 µm to 360 µm. Shallow N+ source regions 42 and P+ body regions are both doped to a concentration of about 1E19/cm3.

FIG. 3A is a graph of the N− type doping concentration versus the lateral distance across the width of JFET region 43 in the example device shown in FIG. 2. As shown, the lateral width of JFET region 43 is equal to 2W, where −W represents the lateral boundary where JFET N+ sidewall area 37a adjoins P− well region 36a, and where W represents the lateral boundary where JFET N+ sidewall area 37b adjoins P− well region 36b. In both of the sidewall areas 37 the doping concentration is $N_{j2}$. The central area of JFET region 43 is shown between −$W_2$ to $W_2$, where the doping concentration is $N_d$.

It is appreciated that in DMOSFET 25 JFET doping concentration $N_{j2}$ in sidewall areas 37 is greater than the JFET doping concentration $N_{j1}$ of traditional DMOSFET 10. JFET doping concentration $N_{j2}$ is selected such that at zero bias the depletion region extends only within the $N_{j2}$ doped sidewall areas 37, thus leaving an undepleted JFET region for conduction that is partially doped $N_{j2}$ and partially doped $N_d$ (i.e., the doping of drift region 35 that extends upward to top surface 31).

FIG. 3B is a graph of electric field at zero bias in the JFET region of the example SiC DMOSFET device shown in FIG. 2. This graph shows the electric field having a maximum value $E_{m2}$ at the lateral distances −W and W. The electric field decreases linearly with distance toward the lightly-doped central area of the JFET region 43. The slope of the electric field is a function of $N_{j2}$ (i.e., the doping concentration of sidewall areas 37), q (the electron charge magnitude), and $\epsilon$ (the product of absolute permittivity of free space multiplied by the relative permittivity of the semiconductor material, e.g., 9.7 for SiC). The amount of sidewall areas 37a & 37b that is depleted is shown by the square root term beneath the graph, where $V_{bi}$ is the built-in voltage that exists due to the difference in doping concentration between adjoining semiconductor regions 36 and 37.

Note that in this example, the depletion regions extend about half the lateral width of each sidewall area 37, thereby making the effective, undepleted JFET region width greater than 2$W_2$. To reiterate, the doping density $N_{j2}$ of JFET sidewall areas 37 is greater than $N_{j1}$, and $N_{j2}$ is chosen such that at zero bias, the depletion regions only extend within the $N_{j2}$ doped regions 37.

Figure 4A:
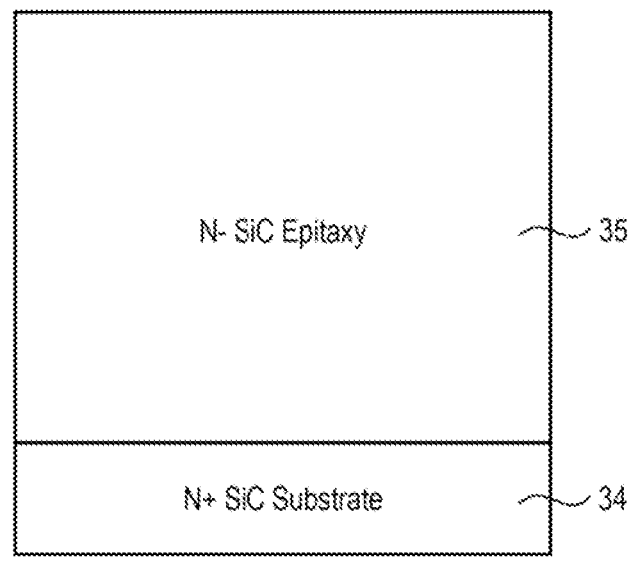
FIGS. 4A-4G illustrates an example cross-sectional side view of the SiC DMOSFET device structure shown in FIG. 2 at various points in the fabrication process.
Figure 4B:
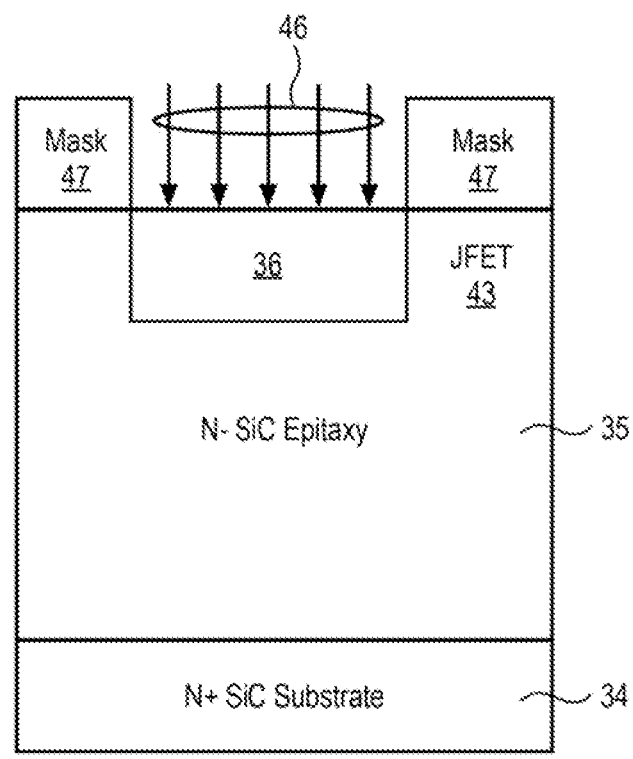
Figure 4C:
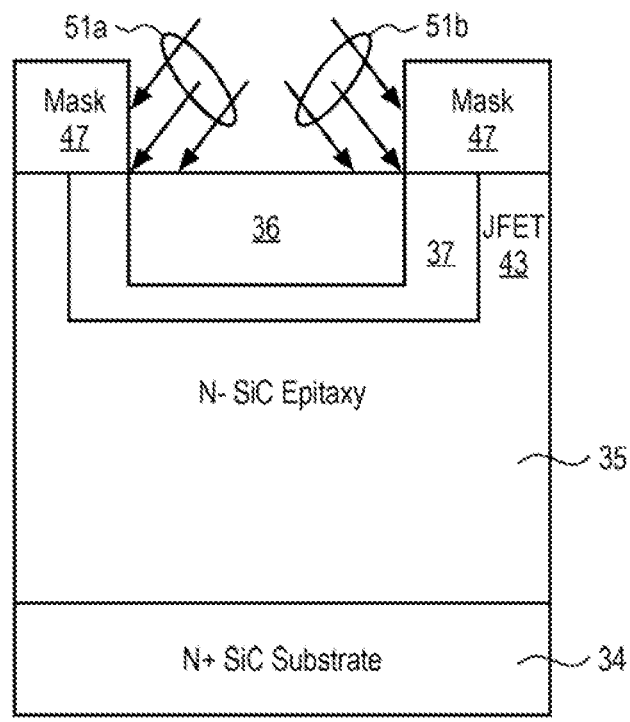
Figure 4D:
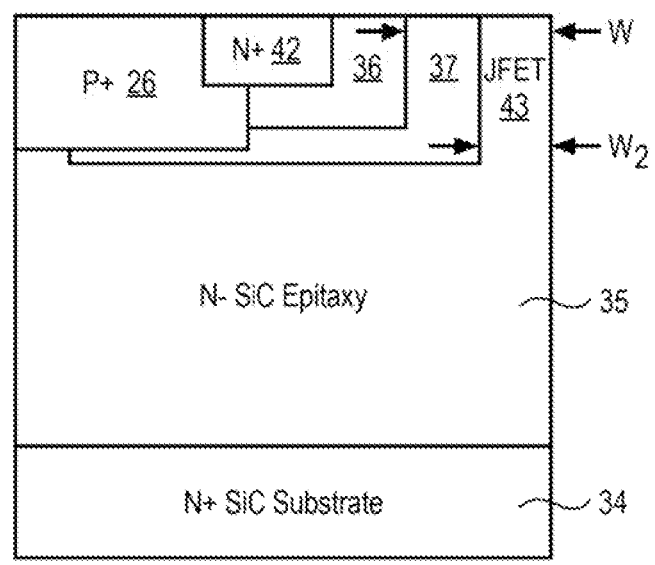
Figure 4E:
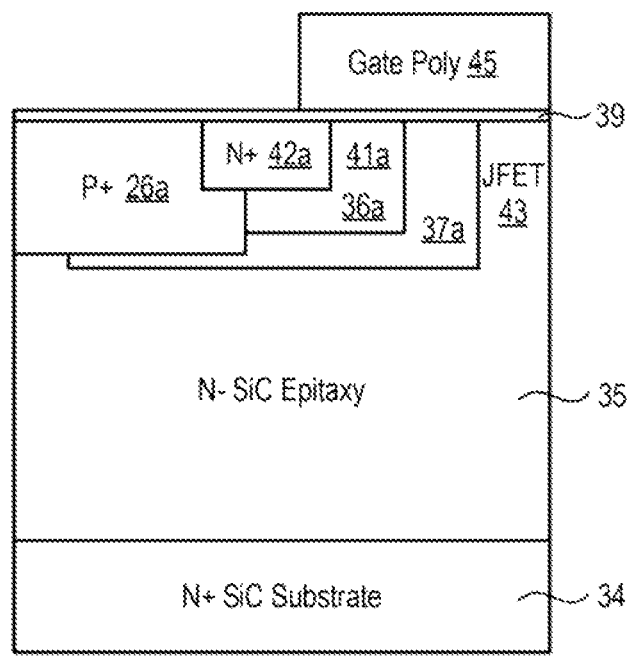
Figure 4F:
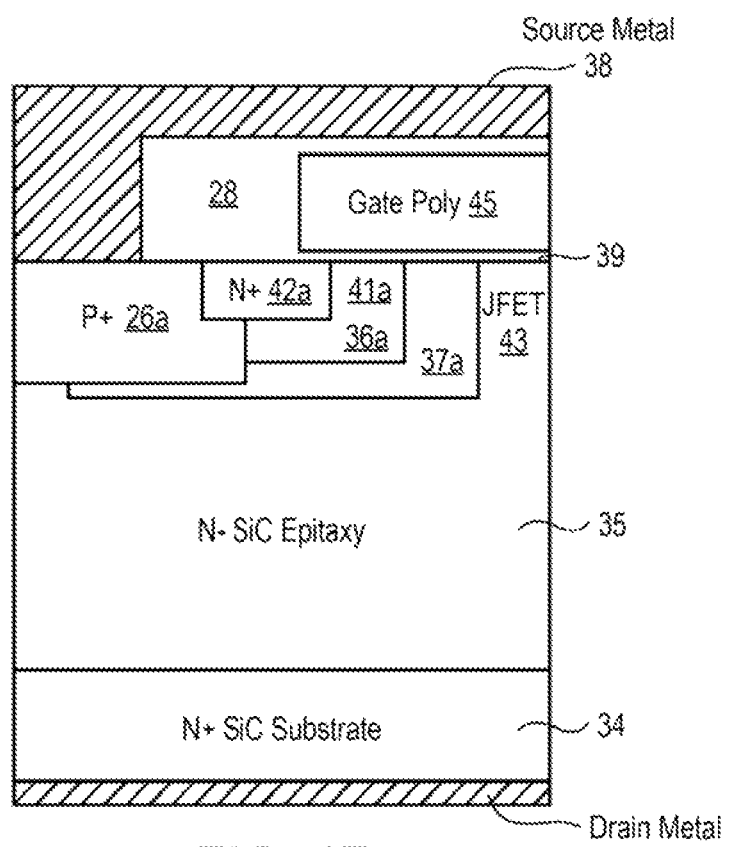
Figures 4G, 5:
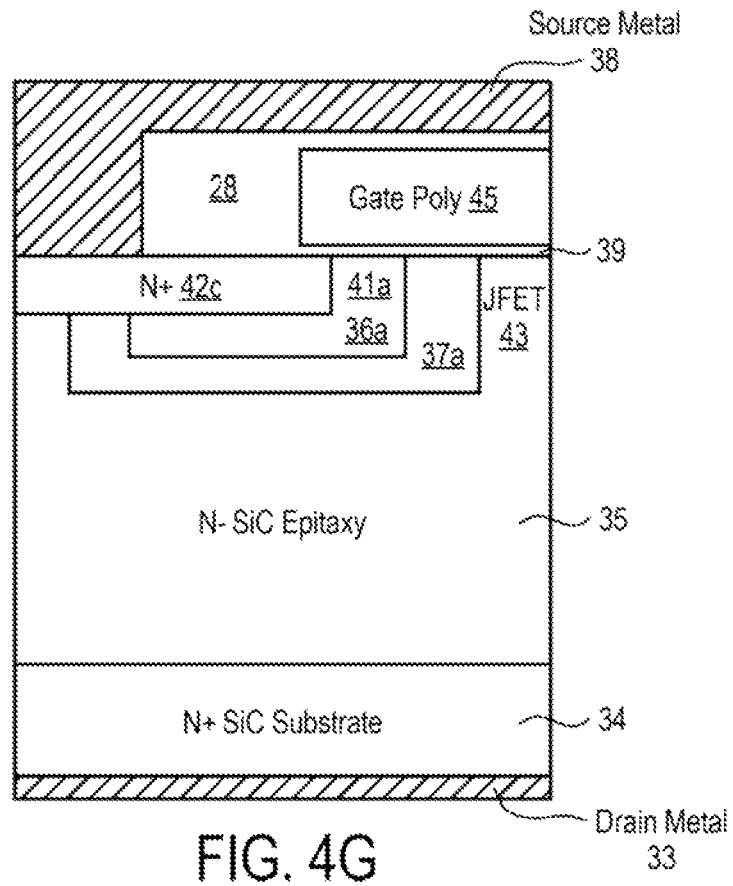
FIG. 5 shows equations for selecting JFET doping and width parameters for a DMOSFET device to match JFET resistance of a traditional design.

FIG. 5 shows a pair of equations that may be used to select JFET doping and width parameters for a DMOSFET device to match the JFET resistance of an existing DMOSFET device structure. In this example, JFET doping of sidewall areas 37 may be selected so as match the JFET resistance of a traditional DMOSFET device at the process center of the traditional design.

Equation 51 provides the design constraint to achieve equal JFET specific resistivity (and equal specific conductivity), where $N_{j1}$ is the doping of JFET region 13 in FIG. 1. $N_{j2}$ is the doping of sidewall areas 37, and $N_d$ is the doping of the drift region that forms the central area of JFET region 43 in the example SiC DMOSFET shown in FIG. 2. Solving equation 51 for $W_2$ yields the lateral width of each of the sidewall regions 37a & 37b, which is given by equation 52.

FIG. 6 shows a set of equations that demonstrate reduced sensitivity of JFET resistance to process variation in the device structure of FIG. 2, as compared to the traditional device of FIG. 1. Equations 61 and 62 respectively express the specific resistivity and specific conductivity of JFET region 13 for DMOSFET 10 shown in FIG. 1, where d is the P− well (or body) implant depth; p is the pitch of the design (well to well); μ is the electron mobility; 2W is the width of JFET region 13; q is the electron charge; ε is the relative permittivity of the material $V_{bi}$ is the built-in voltage; and $N_{j1}$ is the doping of JFET region 13.

Similarly, equations 63 and 64 respectively express the specific resistivity and specific conductivity of JFET region 43 for DMOSFET 25 shown in FIG. 2, where $N_{j2}$ is the doping of sidewall area 37 of JFET 43. Equation 65 expresses the derivative of conductivity in the traditional device as a function of lateral distance, W, as a constant equal to $2N_{j1}q\mu$. Equation 66 expresses the derivative of conductivity in DMOSFET device 25 as a function of lateral distance W. If W−W2 is a constant, which it is in the case of DMOSFET device 25 due to the self-alignment of P− Well regions 36 and respective sidewall regions 37, then equation 67 shows that the sensitivity of the conductivity in JFET region 43 due to process variation (ΔW) is a small fraction ($=N_d/N_{j1}$) of that of JFET region 13. Of course, the same is true for specific resistivity of the respective JFET regions.

Persons of skill understand that it is desired to minimize specific on-resistance (i.e., on-resistance x area) in a power device for certain applications. Reducing the area of a device allows more devices to be yielded from a wafer, thus reducing unit-cost of the devices. Furthermore, the capacitance of a power device also relates to area. Reducing area reduces capacitance and allows a device to switch faster with lesser energy loss. The device structure shown in FIG. 2 advantageously achieves both of these performance improvements by decreasing the sensitivity of the resistivity/conductivity in the JFET region of the device to process variation.

FIGS. 4A-4G illustrates an example cross-sectional side view of the SiC DMOSFET device structure shown in FIG. 2 at various points in the fabrication process. Note that FIGS. 4A-4G show the fabrication process for a half-pitch of the device, the other half-pitch being a mirrored replica of the half shown.

FIG. 4A shows a SiC wafer at a starting point after a SiC N− epitaxial layer 35 has been formed over an N+ SiC substrate 34. Next, the top surface is appropriately masked for ion implantation that forms P− Well region 36 disposed in epitaxial layer 35. This is shown in FIG. 4B where mask 47 defines an opening for implant 46 to dope P− Well region 36. Implant 46 also defines the lateral width of JFET region 43. In one embodiment, P− type implant 46 forms a retrograde doping profile in region 36, with a higher doping concentration at the bottom of the implant region and a lower doping concentration nearest the top surface.

FIG. 4C is an example cross-sectional side view of the SiC DMOSFET device after tilted or angled N− type implants 51a and 51B, which form doped region 37 around P− Well region 36 in epitaxial layer 35. Note that mask 47 remains in place after the P− type implant that formed P− Well region 36. By using the same mask 47 for both implants 46 and 51, N− doped region 37 is self-aligned and adjoined to P− Well region 35. It is understood that implant 51 is a two-set implant process with implants 51a and 51b being performed at the same angle in opposite directions so as to create the sidewall areas 37 of JFET region 43.

In one embodiment, after formation of JFET sidewall areas 37, a P+ implant forms P+ body region 26, followed by an N+ implant that forms N+ source region 42. FIG. 4D is an example cross-sectional side view of the SiC DMOSFET device following these two implants. Note that at this point in the process the JFET width W is defined along with the width $W_2$ which defines the central area of the JFET region 43 comprising N− epitaxy 35.

Next in the fabrication process is the growth of a thin gate oxide 39 over the active area of the device, followed by masking/deposition steps that form a polysilicon gate member 45 that extends laterally over the channel regions 41 and JFET region. This is shown in FIG. 4E.

FIG. 4F shows the SiC DMOSFET device after formation of an interlayer dielectric layer (ILD) 28 over gate member 45, followed by deposition and patterning of the source metal 38. Drain metal 33 is also deposited on the backside of the wafer. At this point, the fabrication process of the DMOSFET device is completed.

FIG. 4G shows an example cross-sectional view of the DMOSFET device taken along a parallel plane to the view of FIG. 4F. This view shows an N+ source contact region 42c which directly contacts source region 42a and source metal 38. Source contact region 42c may be formed using the same implant that forms source region 42a.

FIG. 7 is a chart of simulation test results comparing the sensitivity of JFET resistance to process variation for three different DMOSFET device structures. The three devices include a first prior art device (JFET #1) with a having a JFET width (2W) of 1.5 μm, a second prior art device (JFET #2) having a JFET width of 1.0 μm, and a third device (JFET #3) having a device structure as shown in FIG. 2 with a JFET region width of 1.0 μm.

As shown, for JFET #1 at 1.5 μm of JFET width (2W) ≥W of −0.2 μm only increases traditional JFET resistance from 0.27 mΩcm² to 0.36 mΩcm², an increase of 0.09 mΩcm². But for JFET #2 at 1.0 μm of JFET width (2W), ΔW of −0.2 μm increases traditional JFET resistance from 0.68 mΩcm² to 1.68 mΩcm², an increase of 1.0 mΩcm². In contrast, JFET #3 having the device structure shown in FIG. 2 is designed to have the same $R_{sp}$ as the center case of traditional device (JFET #2) i.e., 0.68 mΩcm² with the same JFET width of 1.0 μm, but at a ΔW of −0.2 μm, $R_{sp}$ only increases to 0.85 mΩcm² which is an increase of only 0.17 mΩcm². Thus, the device structure shown in FIG. 2 significantly reduces the sensitivity of JFET resistance to process variation as compared to traditional designs.

The above description of illustrated example embodiments, including what is described in the Abstract, are not intended to be exhaustive or to be limitation to the precise forms or structures disclosed. While specific embodiments and examples of the subject matter described herein are for illustrative purposes, various equivalent modifications are possible without departing from the broader spirit and scope of the present invention. Indeed, it is appreciated that the specific example widths, thicknesses, material types, doping concentrations, voltages, etc., are provided for explanation purposes and that other values may also be employed in other embodiments and examples in accordance with the teachings of the present invention.

I claim:

1. A metal-oxide semiconductor transistor (MOSFET) comprising:
    a silicon carbide (SiC) substrate of a first conductivity type having top and bottom planar surfaces;
    a drift region of the first conductivity type disposed above the substrate;
    a junction field-effect transistor (JFET) region that extends up to the top planar surface, the JFET region including a central area, which comprises a portion of the drift region that extends vertically to the top planar surface, and first and second sidewall areas disposed on opposite sides of the central area, the central area having a first lateral width and a first doping concentration, the first and second sidewall areas extending vertically to the top planar surface with each having a second lateral width, the first and second sidewall areas each having a second doping concentration that is greater than the first doping concentration such that, at a zero bias condition, first and second depletion regions extend only within the first and second sidewall areas of the JFET region, respectively;

first and second well regions of a second conductivity type that respectively adjoin opposite lateral sides of the JFET region, the first well region adjoining the first sidewall area and the second well region adjoining the second sidewall area, the first and second sidewall areas being respectively self-aligned to the first and second well regions, such that a process variation of well lateral spacing only varies the first lateral width of the central area of the JFET region;

first and second source regions of the first conductivity type that respectively adjoin the first and second well regions, each of the first and second source regions extending up to the top surface, first and second channel regions of the respective first and second well regions laterally separating the first and second source regions from the JFET region, the first and second channel regions extending up to the top surface;

first and second body regions of the second conductivity type that adjoin the first and second source regions a distance away from the first and second channel regions, respectively, the first and second body regions adjoining the first and second well regions, each of the first and second body regions having a portion that extends up to the top planar surface;

a gate member disposed above the top planar surface, the gate member being insulated from the top surface by a thin dielectric layer, the gate member extending laterally over the JFET region and the first and second channel regions;

a top metal layer that electrically contacts the first and second source regions, and the portion of the first and second body regions;

a bottom metal layer electrically coupled to the substrate:

when the MOSFET is in an on-state with a high voltage applied to the gate member relative to the first and second source regions, a conduction channel is formed below the top surface in the first and second channel regions such that a current flows laterally from the first and second source regions to the JFET region, and then in a vertical direction down through the drift region to the substrate.

2. The MOSFET of claim 1 wherein the first lateral width is greater than the process variation.

3. The MOSFET of claim 1 wherein the second lateral width is greater than each of the first and second depletion regions.

4. The MOSFET of claim 1 wherein the first and second well regions extend vertically to a first depth, the first and second sidewall areas extending vertically to a second depth greater than the first depth.

5. The MOSFET of claim 1 wherein the gate member comprises polysilicon.

6. The MOSFET of claim 1 wherein a total lateral width of the JFET region, equal to the first lateral width plus twice the second lateral width, is in a range of about 0.8 µm to 1.5 µm.

7. The MOSFET of claim 1 wherein the conductivity type is N− type and the second conductivity type is P− type.

8. The MOSFET of claim 1 wherein the second doping concentration is at least 4 times greater than the first doping concentration.

9. The MOSFET of claim 4 wherein the first depth is about 1.0 µm.

10. The MOSFET of claim 1 wherein when the MOSFET is in the on-state an undepleted portion of the JFET region conducts the current, the undepleted portion including a first portion doped to the first doping concentration, and second portions doped to the second doping concentration.

11. A method of fabricating a power transistor device comprising:

forming an silicon carbide (SiC) epitaxial layer over a SiC substrate, the SiC epitaxial layer and the substrate both having an N− type conductivity, the SiC epitaxial layer comprising a drift region of the power transistor device;

forming a mask layer on a top surface of the SiC epitaxial layer, the mask layer defining openings;

implanting a P− type dopant through the openings to form P− well regions in the SiC epitaxial layer, the openings being spaced-apart such that a JFET region is formed between adjacent P− well regions;

performing first and second angled implants of an N− type dopant through the openings to respectively form N+ sidewall areas in the JFET region, each N+ sidewall region laterally adjoining one of the P− well regions, the N+ sidewall areas being separated in the JFET region by a central area comprising a portion of the SiC epitaxial layer that extends to the top surface, the N+ sidewall areas each having a doping concentration greater than a doping concentration of the SiC epitaxial layer, the N+ sidewall areas being self-aligned to the P− well regions by the mask layer such that a process variation of P− well lateral spacing only varies the first lateral width of the central area of the JFET region;

forming N+ source regions disposed in each of the P− well regions, each of the source regions extending up to the top surface, a channel region of each of the P− well regions laterally adjoining the JFET region, the channel region extending up to the top surface and laterally separating each N+ source region from an adjacent JFET region by a channel length;

forming P+ body regions each of which adjoin an N+ source region and a P− well region, each P+ body region extending up to the top surface;

forming a gate member disposed above the top surface, the gate member being insulated from the top surface by a thin dielectric layer, the gate member extending laterally over the JFET region and each channel region;

a top metal layer that electrically contacts the N+ source regions and the P+ body regions; and a bottom metal layer electrically coupled to the SiC substrate.

12. The method of claim 11 wherein the N+ sidewall areas each extend vertically from the top surface down to at least a depth of the P− well regions.

13. The method of claim 11 wherein the N+ sidewall areas each have a lateral width greater than a width of depleted regions of the N+ sidewall areas.

14. The method of claim 11 wherein the central area of the JFET region has a lateral width greater than the process variation.

15. The method of claim 11 wherein the gate member comprises polysilicon.

16. The method of claim 11 wherein the doping concentration of the N+ sidewall areas is at least 4 times greater than the doping concentration of the SiC epitaxial layer.

17. The method of claim 12 wherein the depth of the P− well regions is approximately 1.0 µm.

18. The method of claim 17 wherein a lateral width of the JFET region is approximately 1.0 µm.

19. The method of claim 17 wherein the process variation is about ±0.2 µm.

\* \* \* \* \*